RE 25256

May 10, 1960 G. SCHWEITZER 2,936,428

OSCILLATOR HAVING VOLTAGE-SENSITIVE TUNING CAPACITOR BIASED BY OSCILLATOR GRID SELF-BIAS AND EXTERNAL SIGNAL

Filed April 20, 1959

INVENTOR.
GERHARD SCHWEITZER
BY
Mestern & Kollin
ATTORNEYS 2,936,428
Patented May 10, 1960

1

2,936,428

OSCILLATOR HAVING VOLTAGE-SENSITIVE TUNING CAPACITOR BIASED BY OSCILLATOR GRID SELF-BIAS AND EXTERNAL SIGNAL

Gerhard Schweitzer, Mannheim-Rheinau, Germany, assignor to Julius Karl Goerler Transformatorenfabrik, Berlin-Reinickendorf, Germany, a firm Application April 20, 1959, Serial No. 807,366

Claims priority, application Germany May 8, 1958

5 Claims. (Cl. 331—177)

The invention concerns a circuit arrangement for the automatic tuning of oscillators for frequency modulation receivers by means of a semi-conductor diode influencing the frequency of the oscillator tank circuit and acting as a voltage dependent capacity, preferably a silicon diode which is connected with decoupling components via which the diode is supplied substantially with a constant cut-off voltage and at the same time with a frequency determining variable control voltage. The invention consists in the fact that the rectified oscillating voltage of the oscillator is applied to the semi-conductor diode as a blocking auxiliary voltage.

It is convenient in this case for the diode to be connected on the one hand by avoiding additional potential dividers, eliminators, coupling and decoupling means for supplying the cut-out voltage directly with a point of the oscillatory circuit simultaneously carrying a grid and oscillating voltage potential, for example, the control grid of the oscillator tube, and on the other hand via a coupling capacitor which is of small capacity compared with the diode capacity to a further point of the oscillatory circuit showing a different oscillating voltage potential, for example, to the anode end of the oscillator tank circuit and via a decoupling resistor with the control voltage source for the purpose of supplying the control voltage determining the frequency.

It may also be an advantage for the connections to be so varied that one tank circuit is directly connected to the grid of the oscillator tube, wherein the charging capacitor for the grid detection may be connected between a point of the tank circuit and ground, whereby the semi-conductor diode on the one hand and the remote end of the small coupling capacitor connected in series therewith on the other hand is connected in parallel with the tank circuit of the rectified alternating current potential carrying the potential.

It is known to couple semi-conductor diodes to the tank circuit of oscillators in frequency modulation receivers and to supply to them via high frequency coupling components arranged on either side on the one hand a positive cut-out auxiliary voltage originating from a separate voltage divider or the cathode of an amplifying stage, and on the other hand the frequency determining control voltage. Thus the terminal corresponding to the cathode of the diode is connected via a coupling capacitor with the grid of the oscillator tube and the other terminal of the diode with ground via a blocking capacitor. The terminal of the semi-conductor diode coresponding to the cathode is supplied from the cathode of the first intermediate frequency amplifying tube via a high frequency choke with a positive cut-out voltage of about 1.5 volts and to the terminal of the diode corresponding to the anode supplied from the discriminator or ratio detector of the receiver via low frequency suppressing RC filter sections a control voltage depending upon the detuning of the central frequency. For coupling the diode to the oscillator

2 and to the high frequency coupling supply of cut-off and control voltage there are required herein four units in all, namely a resistor, a choke and two capacitors.

Besides the production of a diode voltage in a specially provided voltage divider is already known but involves further structural units and filter means.

On the other hand the invention allows the diode to be inserted in the circuit by means of two structural elements only, wherein the grid direct current voltage of the oscillator is used as a cut-off voltage, thereby avoiding a separate source of voltage or a separate voltage divider, which produces the cut-off voltage from the anode voltage source. Besides a reduction of expenditure there is a noticeable saving of space also achieved by this in the narrowly constructed ultra short wave tuning units, since the choke is omitted.

The invention will be described further, by way of example, with reference to the accompanying drawings, in which:

Fig. 1 is a perspective view of the tuning device adapted to be inserted and comprising a silicon diode, the decoupling resistor and coupling block capacitor;

Fig. 2 is a circuit diagram of the tuning device according to Fig. 1;

Fig. 3 is a circuit diagram of an oscillator having a tuning device inserted therein;

Fig. 4 is a circuit diagram of a self excited neutralized conversion detector of a tuning unit in a frequency modulation receiving set;

Fig. 5 is a circuit diagram of a three point oscillator having a tuning device inserted therein; and Figs. 5 and 6 are variations for the arrangement according to Fig. 5.

Figures 1, 2, 3, 4, 5, 6, 7:
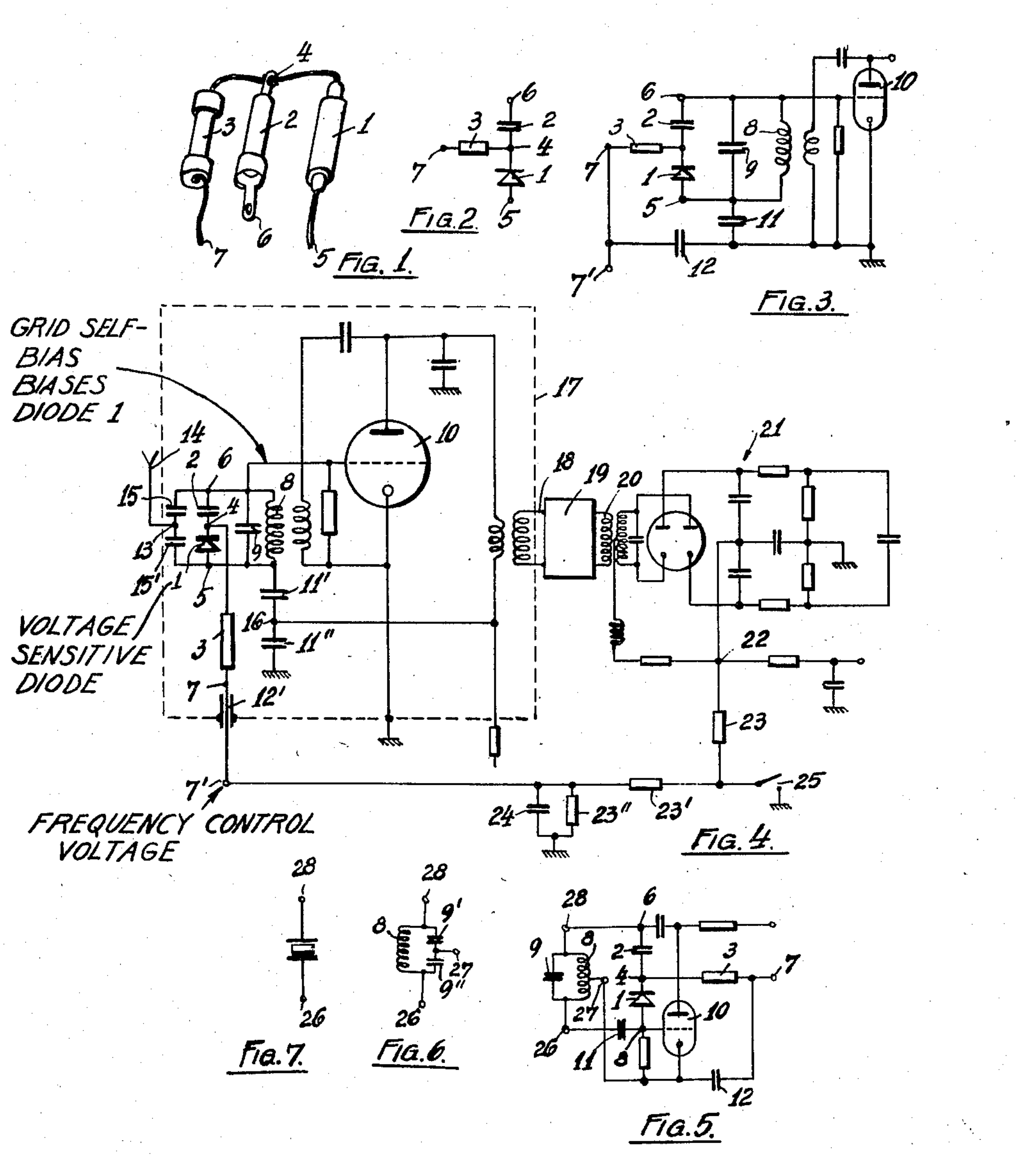

Figs. 1 and 2 show the connection or assembly of the tuning devices suitable for incorporation in conventional oscillators and comprising a silicon diode 1, a coupling capacitor 2 and a decoupling resistor 3, wherein the three circuit elements 1, 2, 3 on the one side are unilaterally interconnected in the neutral point 4 and on the other side have free terminal ends 5, 6, 7.

In accordance with experience, semi-conductors, especially silicon diodes, have substantially different self-capacity. The dispersal range caused thereby of the capacity appearing between the terminals 5 and 6 of the tuning device is considerably restricted by the selection of a coupling condenser small even in comparison with that of the smallest possible diode capacity (approx. 1 pf.), so that during production the given diode capacity need not be taken into consideration.

Fig. 3 shows the tuning device inserted in a Meisner oscillator. The terminals 5 and 6 herein are connected in parallel to the tank circuit formed by the coil 8 and the capacitor 9, which with one of its ends is directly connected with the grid of the oscillator tube 10, so that it carries the direct current grid voltage and transmits the latter to the diode as cut-off voltage. The capacitor 10 on the one hand serves as grounding capacitor for the other tank circuit end, and on the other hand acts as charging capacitor during rectification at the grid of the oscillator tube 10. The capacitor 12 provides the high and possibly intermediate frequency grounding of the terminal point 7 or 7', via which the control voltage for the actuation of the tuning device is supplied from the outside.

Fig. 4 shows a modified Meisner oscillating circuit of Fig. 3, which by including the condensers 15, 15' forming an oscillating circuit tapping 13 for connecting an antenna 14 or capacitors 15, 15' of a previous stage into the tank circuit 8, 9 and by dividing the grid charging capacitor into the two capacitors 11' and 11" and connection of the connecting point 16 thereof to the anode of the oscillator tube is extended to a self-oscillating conversion detector neutralized with regard to the antenna point 13.

This oscillator mixing stage, if necessary inclusive a high frequency pre-amplifying stage (not shown), forms a tuning unit and is accommodated in a screening housing 17, through which the connecting leads are passed possibly via lead-in capacities 12'. The intermediate frequency output 18 of the tuning unit is connected with a diagrammatically shown intermediate frequency amplifier 19 the output 20 of which feeds a ratio detector 21. The direct current voltage component occurring at the low frequency output 22 thereof dependent upon the detuning of the central frequency of the signal received relative to the central frequency of the ratio detector 21 and is supplied as tuning control voltage via a RC filter section 23, 23', 23'', 24, 12' to the point 7 of the tuning device 1, 2, 3. This control voltage may be switched off by means of the switch 25.

Fig. 5 shows a three point Hartley oscillator circuit in which the tuning device is so inserted that the diode terminal 5 is in direct connection with the control grid of the oscillator tube 10 and the capacitor terminal 6 with the anode end of the tank circuit 8, 9. Similarly it is also possible for other oscillation circuits to be carried out, for example a Colpitts or a Pierce circuit, in that a potential division is used. For this purpose it is possible to use in accordance with Fig. 6 a capacitively tapped tank circuit between the terminals 26, 27 and 28 in place of an inductively tapped tank circuit 8, 9, in which the tank circuit capacity is divided into two condensers 9', 9'' connected in series, or it is possible in accordance with Fig. 7 to insert a piezoelectric resonator between the terminals 26 and 28, whereby the capacitive potential division is effected via the inner tube capacities and the tuning range being substantially smaller than in the case of oscillators operating with the normal tank circuits.

I claim:

1. In a frequency modulation receiver circuit, an oscillator tank circuit, an arrangement for automatic oscillator tuning comprising a semi-conductor diode such as a silicon diode adapted to act as a potential dependent capacity influencing the frequency of the oscillator tank circuit, decoupling components connected to said diode, means for supplying by way of said decoupling components a substantially constant cut-off voltage to said diode, means for supplying by way of said decoupling components a frequency determining variable control voltage to said diode, means for rectifying the oscillator output, and means for applying the rectified oscillator output as a suppressing auxiliary voltage to said diode.

2. An arrangement as defined in claim 1, including means for connecting the diode directly with one point of the tank circuit carrying the grid and oscillating potential, a capacitor having a capacity which is small relative to the diode capacity, means for connecting the diode by way of said capacitor to another point of the tank circuit having a different oscillating potential, a control voltage source, a decoupling means, and means for connecting said diode to said control voltage source by way of said decoupling means.

3. An arrangement as defined in claim 1, including means for connecting the diode directly with one point of the tank circuit carrying the grid and oscillating potential, a capacitor having a capacity which is small relative to the diode capacity, means for connecting the diode by way of said capacitor to ground, a control voltage source, a decoupling means, and means for connecting said diode to said control voltage source by way of said decoupling means.

4. An arrangement as defined in claim 1, including an oscillator tube having a grid, means for connecting a point on the tank circuit directly to said grid, a capacitor for grid rectification, means for connecting said grid rectification capacitor between a point of the tank circuit and ground, a coupling capacitor having a small capacity relative to the diode capacity, and means for connecting the diode in series with said small capacitor across the tank circuit.

5. In a frequency modulation receiver circuit, a semiconductor diode such as a silicon diode having an anode and a cathode, means for adjusting the capacity of said diode by a control voltage, a capacitor having two poles, a resistor having two ends, means for electrically connecting together one pole of the capacitor, one end of the resistor and the cathode of the diode, means for connecting the anode of the diode to one point of the oscillator which simultaneously carries the oscillating voltage and the direct current grid voltage originating from grid detection, means for connecting the other pole of the capacitor to a point of the oscillator which carries a substantially different oscillating potential, and means for connecting the other end of the resistor to a point carrying a frequency determining variable control voltage.

References Cited in the file of this patent

UNITED STATES PATENTS

| | | |
|---|---|---|
| 2,243,921 | Rust | June 3, 1941 |
| 2,841,711 | Kock | July 1, 1958 |